US011410893B1

(12) United States Patent
Li et al.

(10) Patent No.: US 11,410,893 B1
(45) Date of Patent: Aug. 9, 2022

(54) SEMICONDUCTOR STRUCTURE

(71) Applicant: NANYA TECHNOLOGY CORPORATION, New Taipei (TW)

(72) Inventors: Yu-Che Li, Taoyuan (TW); Tsang-Po Yang, New Taipei (TW); Hsueh-Han Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/163,551

(22) Filed: Jan. 31, 2021

(51) Int. Cl.
*H01L 21/66* (2006.01)
*H01L 29/36* (2006.01)
*H01L 29/08* (2006.01)

(52) U.S. Cl.
CPC .......... *H01L 22/34* (2013.01); *H01L 29/0843* (2013.01); *H01L 29/36* (2013.01)

(58) Field of Classification Search
CPC ......... H01L 22/12; H01L 22/14; H01L 22/34; H01L 29/0843; H01L 29/36
See application file for complete search history.

(56) References Cited

U.S. PATENT DOCUMENTS

2013/0270606 A1* 10/2013 Chen .................... H01L 21/2253
257/E21.409

* cited by examiner

*Primary Examiner* — Syed I Gheyas
(74) *Attorney, Agent, or Firm* — CKC & Partners Co., LLC

(57) ABSTRACT

The semiconductor structure includes a substrate, a deep well, a first doped region, a source/drain region, and a first heavily doped region. The substrate has a first conductivity type. The deep well has a second conductivity type disposed on the substrate. The first doped region has the first conductivity type disposed on the deep well. The source/drain region has the second conductivity type disposed on the first doped region. The first heavily doped region has the second conductivity type disposed in a first top region of the source/drain region, in which the first conductivity type is opposite to the second conductivity type.

14 Claims, 5 Drawing Sheets

SEMICONDUCTOR STRUCTURE

BACKGROUND

Field of Invention

The present invention relates to a semiconductor structure.

Description of Related Art

In the semiconductor technology, it is important to meet the requirements of quality of a semiconductor device. In general, a wafer has a plurality of scribe lines, and those scribe lines form scribe regions to isolate individual integrated circuit (IC) chips. Individual IC chips are formed by dicing the scribe lines of the wafer.

Test element groups (TEGs) are usually formed on the scribe lines of the wafer because TEGs would no longer be functional after the wafer is diced. TEGs are used for evaluating circuit characteristics of the semiconductor device. However, the dimension of the semiconductor device has been shrinking, and the density of the semiconductor device also has been increasing. Thus, the efficiency of semiconductor devices is also important. Therefore, there is a need for a novel TEG to secure the reliability of semiconductor devices.

SUMMARY

One aspect of the present disclosure is to provide a semiconductor structure. The semiconductor structure includes a substrate, a deep well, a first doped region, a source/drain region, and a first heavily doped region. The substrate has a first conductivity type. The deep well has a second conductivity type disposed on the substrate. The first doped region has the first conductivity type disposed on the deep well. The source/drain region has the second conductivity type disposed on the first doped region. The first heavily doped region has the second conductivity type disposed in a first top region of the source/drain region, in which the first conductivity type is opposite to the second conductivity type.

According to some embodiments of the present disclosure, the semiconductor structure further includes a second doped region and a second heavily doped region. The second doped region has the first conductivity type disposed on the deep well and adjacent to the first doped region and the source/drain region. The second heavily doped region has the first conductivity type disposed in a second top region of the second doped region.

According to some embodiments of the present disclosure, the first heavily doped region and the second heavily doped region respectively have a doping concentration between $10^{18}$ cm$^{-3}$ and $10^{19}$ cm$^{-3}$.

According to some embodiments of the present disclosure, the first doped region and the second doped region respectively have a doping concentration between $10^{16}$ cm$^{-3}$ and $10^{18}$ cm$^{-3}$.

According to some embodiments of the present disclosure, the first doped region has a first projection on the deep well, the second heavily doped region has a second projection on the deep well, and the first projection is spaced apart from the second projection.

According to some embodiments of the present disclosure, the first heavily doped region extends along a first direction, the second heavily doped region extends along a second direction, and the first direction is substantially perpendicular to the second direction.

According to some embodiments of the present disclosure, the semiconductor structure further includes a second heavily doped region having the second conductivity type disposed in a second top region of the source/drain region, in which the first heavily doped region and the second heavily doped region are separated from each other by the source/drain region.

According to some embodiments of the present disclosure, the first heavily doped region and the second heavily doped region respectively have a doping concentration is between $10^{18}$ cm$^{-3}$ and $10^{19}$ cm$^{-3}$.

According to some embodiments of the present disclosure, the semiconductor structure further includes a second doped region having the first conductivity type disposed on the deep well, and adjacent to the first doped region, the source/drain region, and the second heavily doped region.

According to some embodiments of the present disclosure, the first doped region and the second doped region respectively have a doping concentration between $10^{16}$ cm$^{-3}$ and $10^{18}$ cm$^{-3}$.

According to some embodiments of the present disclosure, the source/drain region has a doping concentration between $10^{18}$ cm$^{-3}$ and $10^{19}$ cm$^{3}$.

According to some embodiments of the present disclosure, the deep well has a doping concentration between $10^{16}$ cm$^{-3}$ and $10^{17}$ cm$^{-3}$.

According to some embodiments of the present disclosure, the semiconductor structure further includes a second doped region having the first conductivity type disposed on the deep well, and adjacent to the first doped region, the source/drain region, and the first heavily doped region.

According to some embodiments of the present disclosure, the second doped region has a doping concentration between $10^{16}$ cm$^{-3}$ and $10^{18}$ cm$^{-3}$.

According to some embodiments of the present disclosure, the first conductivity type is P type, and the second conductivity type is N type.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
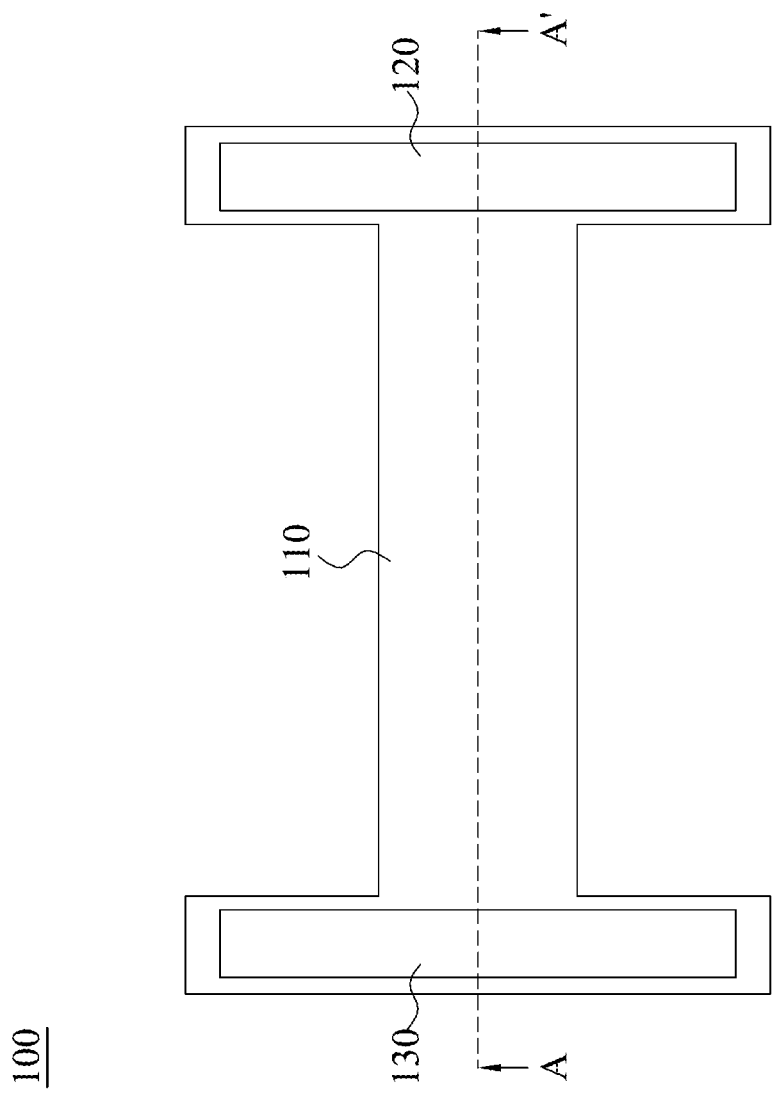
FIG. 1 is a top view of a semiconductor structure in accordance with some comparative embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It should be understood that the number of any elements/components is merely for illustration, and it does not intend to limit the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Test element groups (TEGs) are usually formed on scribe lines of the wafer to evaluate circuit characteristics of a semiconductor device. After those circuit characteristics in TEGs are tested, TEGs would be destroyed by dicing the scribe lines of a wafer. Hence, TEGs would no longer functional after dicing to obtain a plurality of individual integrated circuit (IC) chips. In addition, it is understood that TEGs and IC chips are formed by the same manufacturing process. Accordingly, the circuit characteristics of IC chips can be correctly deduced by testing TEGs.

A structure of TEG can be changed according to the desired characteristic which is needed to be tested. For example, a resistance of a doped region, a junction leakage, a resistance of source/drain resistance can be tested by different TEGs. However, it is understood that a single TEG is usually used to evaluate only one circuit characteristic of the semiconductor device. In view of this, the present disclosure provide a new TEG which can test multiple circuit characteristics.

Figure 2:
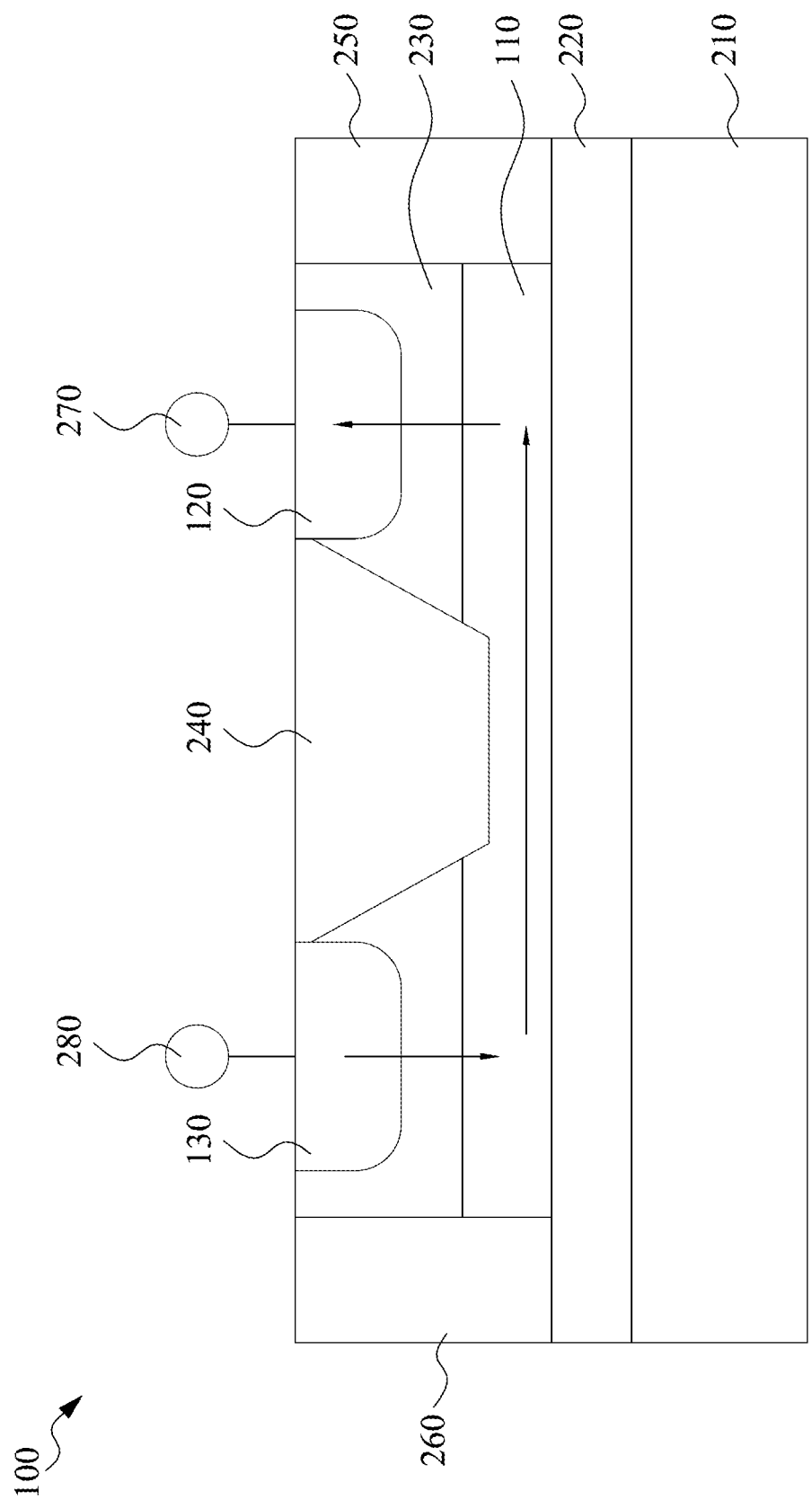
FIG. 2 is a cross-sectional view of the semiconductor structure of FIG. 1 taken along line A-A' in accordance with some comparative embodiments of the present disclosure.

FIG. 1 is a top view of a semiconductor structure 100 in accordance with some comparative embodiments of the present disclosure. FIG. 2 is a cross-sectional view of the semiconductor structure of FIG. 1 taken along line A-A' in accordance with some comparative embodiments of the present disclosure. It is noticed that some elements of FIG. 2 are not illustrated in FIG. 1 for clarity.

Please refer to FIG. 1 and FIG. 2 at the same time, the semiconductor structure 100 includes a doped region 110, a heavily doped region 120, and a heavily doped region 130. Specifically, the doped region 110 has an I-shaped region, and the heavily doped region 120 and the heavily doped region 130 respectively have a rectangular-shaped region. More specifically, the doped region 110 is disposed below the heavily doped region 120 and the heavily doped region 130, as shown in FIG. 2. In some embodiments, the doped region 110, the heavily doped region 120, and the heavily doped region 130 respectively have a P type doped region. It should be understood that P type refers to P type dopants, such as boron (B), but not limited thereto; and N type refers to N type dopants, such as phosphorous (P) or arsenic (As), but not limited thereto.

Please refer to FIG. 2, the semiconductor structure 100 further includes a substrate 210, a deep well 220, a source/drain region 230, an isolation region 240, a doped region 250, a doped region 260, a local contact 270, and a local contact 280. In some embodiments, the source/drain region 230 is disposed between the doped region 110, the heavily doped region 120, and the heavily doped region 130. In some embodiments, the source/drain region 230 has an N type doped region. In some embodiments, a doping concentration of the source/drain region 230 is a relatively low doping concentration, for example, the source/drain region 230 has a doping concentration less than $10^{18}$ cm$^{-3}$. In some embodiments, a doping concentration of the source/drain region 230 is a relatively high doping concentration, for example, the source/drain region 230 has a doping concentration greater than $10^{18}$ cm$^{-3}$. In some embodiments, the isolation region 240 is disposed in the source/drain region 230 and a portion of the doped region 110. In some embodiments, the isolation region 240 may be a shallow trench isolation (STI) region, in which the isolation region 240 separates the heavily doped region 120 and the heavily doped region 130. In some embodiments, the isolation region 240 may be a field oxide region, which is formed by oxidizing silicon. In some embodiments, the isolation region 240 is disposed for electrically isolating the source/drain region 230. In some embodiments, the doped region 250 and the doped region 260 respectively have an N type doped region.

Please refer to FIG. 2 again. Biases could be applied to conductive pads (not shown) which are electrically connected to the heavily doped region 120 and the heavily doped region 130 through the local contact 270 and the local contact 280, respectively. Subsequently, the circuit characteristic of the doped region 110 could be checked. In detail, the charge carrier pathway (indicated by the arrows) within the semiconductor structure 100 shows in FIG. 2 when biases are applied. The semiconductor structure 100 could test the resistance of the doped region 110, thereby securing the reliability of the semiconductor device.

It should be noticed that the junction leakage would occur in the junction between the doped region 110 and the source/drain region 230, which is also called PN junction. In general, in the case that the doping concentration of the source/drain region 230 is a relatively low doping concentration, the junction leakage is quite small, and so the junction leakage can be ignored. However, it is observed that the resistance of the doped region 110 would be changed when the doping concentration of the source/drain region 230 is relatively high. In other words, the tested resistance of the doped region 110 is not accurate. Therefore, in the case that the doping concentration of the source/drain region 230 is relatively high, the junction leakage is no longer small, and so the junction leakage cannot be ignored.

Figure 3:
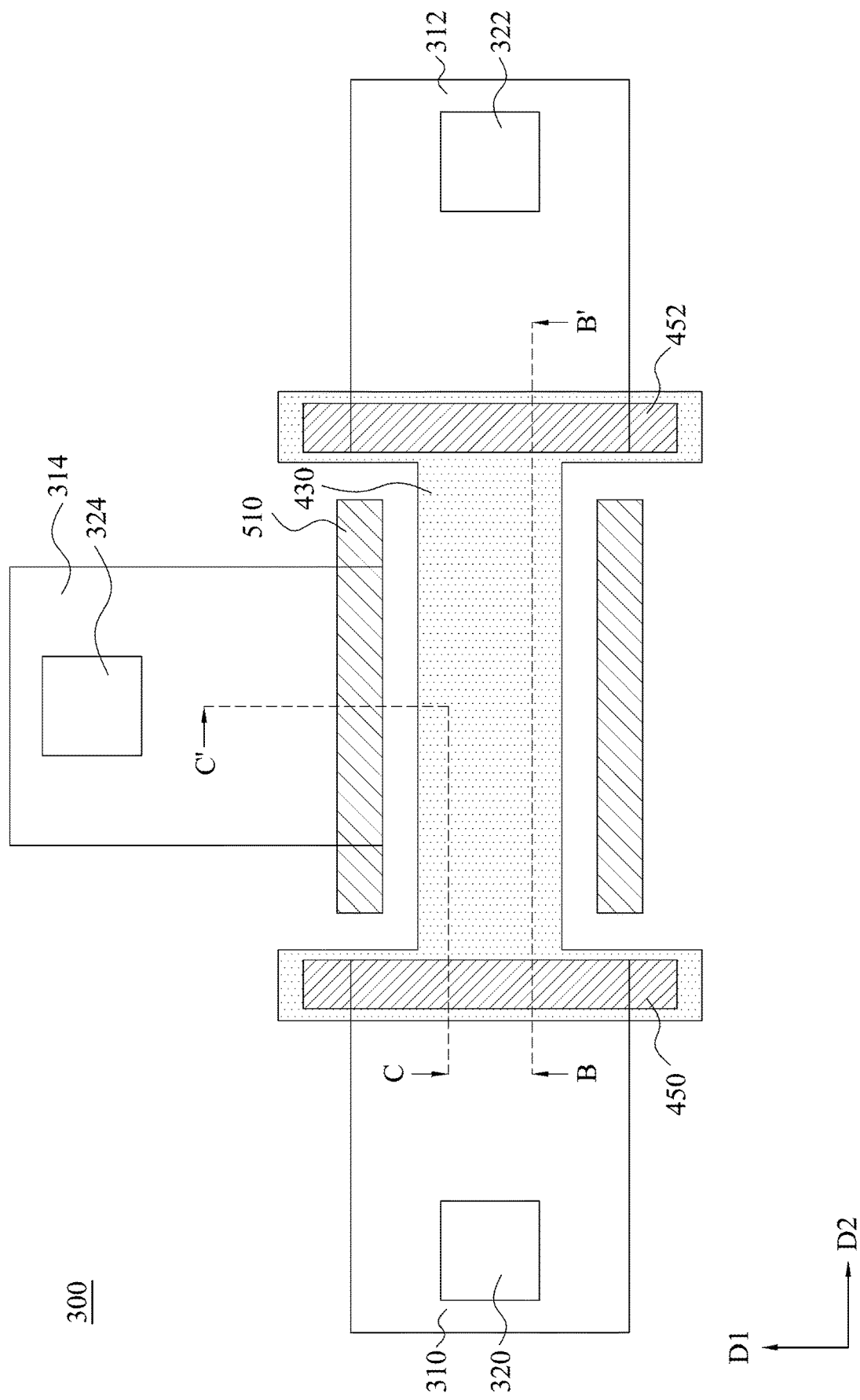
FIG. 3 is a top view of a semiconductor structure in accordance with some embodiments of the present disclosure.
Figure 4:
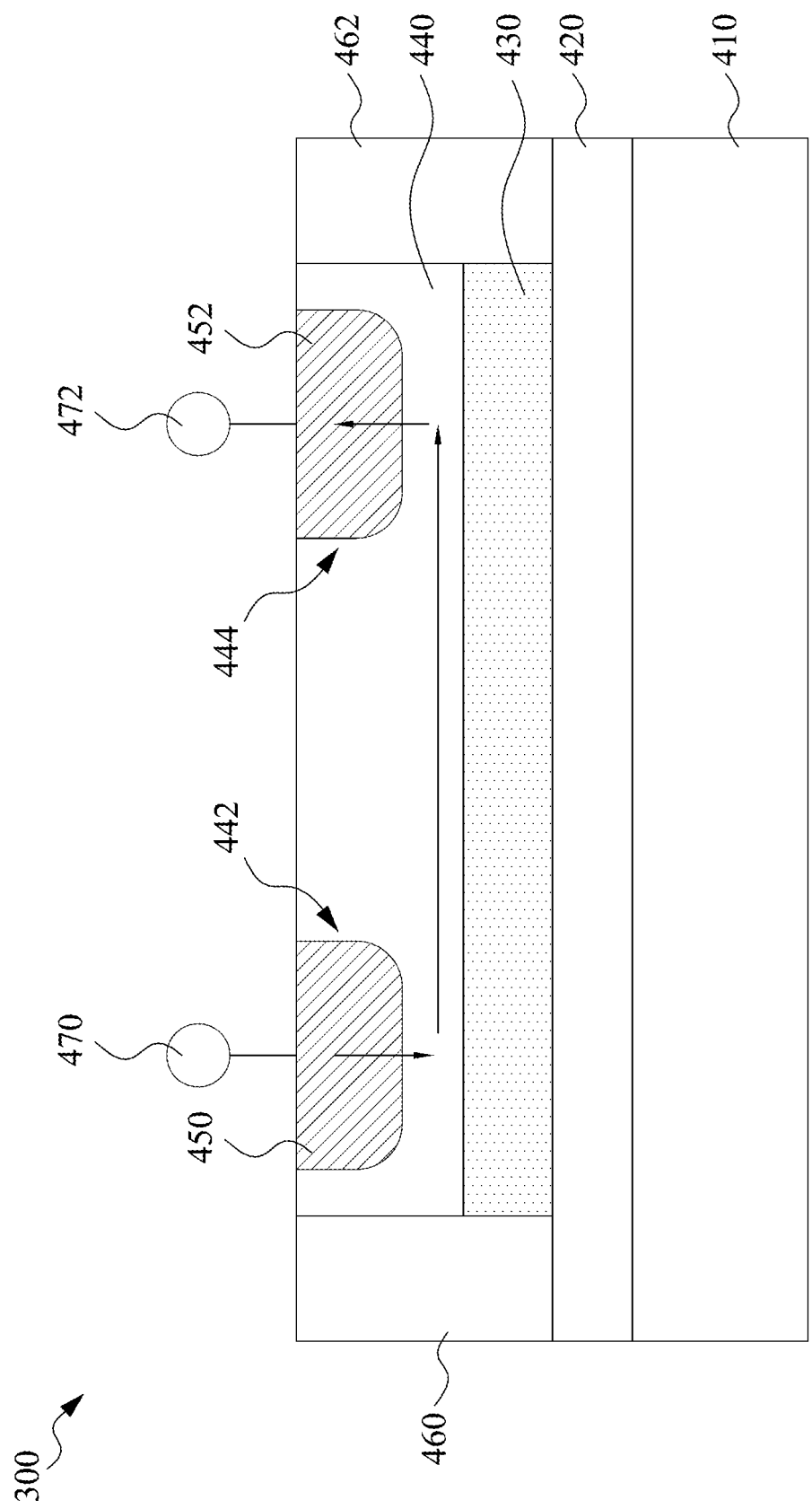
FIG. 4 is a cross-sectional view of the semiconductor structure of FIG. 3 taken along line B-B' in accordance with some embodiments of the present disclosure.
Figure 5:
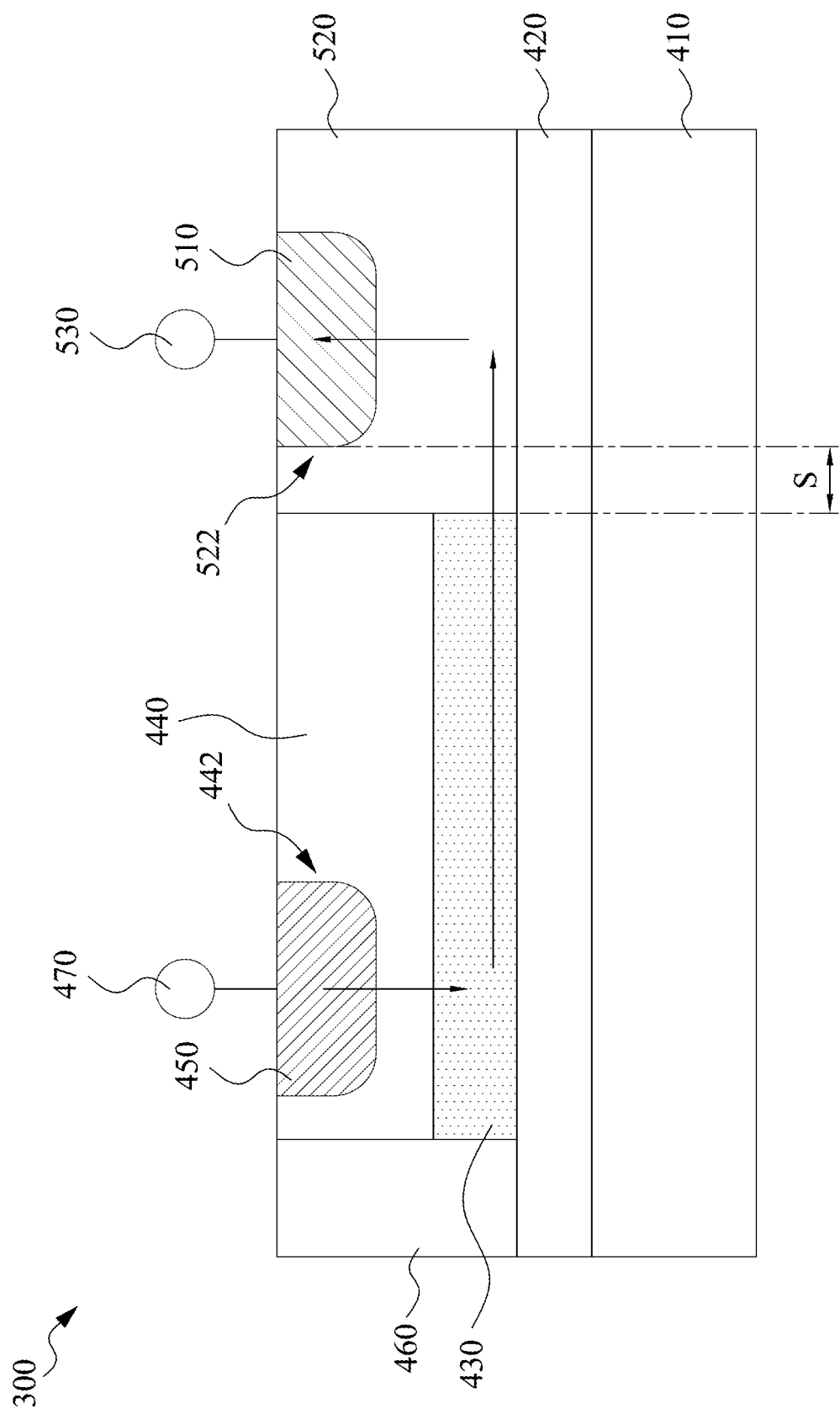
FIG. 5 is a cross-sectional view of the semiconductor structure of FIG. 3 taken along line C-C' in accordance with some embodiments of the present disclosure.

FIG. 3 is a top view of a semiconductor structure 300 in accordance with some embodiments of the present disclosure. FIG. 4 is a cross-sectional view of the semiconductor structure 300 of FIG. 3 taken along line B-B' in accordance with some embodiments of the present disclosure. FIG. 5 is a cross-sectional view of the semiconductor structure 300 of FIG. 3 taken along line C-C' in accordance with some embodiments of the present disclosure. It is noticed that some elements of FIG. 3 are not illustrated in FIG. 4 and FIG. 5 for clarity, and some elements of FIGS. 4 and 5 are not illustrated in FIG. 3 for clarity.

Please refer to FIG. 4 firstly. The semiconductor structure 300 includes a substrate 410, a deep well 420, a doped region 430, a source/drain region 440, and a heavily doped region 450. The substrate 410 has a first conductivity type. The deep well 420 has a second conductivity type disposed on the substrate 410. The doped region 430 has the first conductivity type disposed on the deep well 420. The source/drain region 440 has the second conductivity type disposed on the doped region 430. The heavily doped region 450 has the second conductivity type disposed in a top region 442 of the source/drain region 440, in which the first conductivity type is opposite to the second conductivity type. In some embodiments, the first conductivity type is P type, and the second conductivity type is N type. In some other embodiments, the first conductivity type is N type, and the second conductivity type is P type. It should be understood that P type refers to P type dopants, such as boron (B), but not limited thereto; and N type refers to N type dopants, such as phosphorous (P) or arsenic (As), but not limited thereto.

In some embodiments, the substrate 410 may be a semiconductor substrate such as a silicon substrate. In some embodiments, the substrate 410 includes an elementary semiconductor including silicon or germanium in crystal, polycrystalline, and/or an amorphous structure; a compound semiconductor including SiC, GaAs, GaP, InP, InAs, and/or InSb; an alloy semiconductor including SiGe, GaAsP, AlInAs, AlGaAs, GaInAs, GaInP, and/or GaInAsP; any other suitable material; and/or a combination thereof. In some embodiments, the substrate 410 may optionally include an epitaxial layer, may be strained for performance enhancement, and/or may include a silicon-on-insulator (SOI) structure. In some embodiments, the substrate 410 has the first conductivity type, such as P type.

In some embodiments, the deep well 420 is formed by implanting dopants to a portion of the substrate 410. In some embodiments, the deep well 420 is an N type doped region, and the deep well 420 also can be referred to as deep N well. In some embodiments, the deep well 420 has a doping concentration between $10^{16}$ cm$^{-3}$ and $10^{17}$ cm$^{-3}$. In some embodiments, the doped region 430 is a P type doped region, and the doped region 430 also can be referred to as cell well. In some embodiments, the doped region 430 has a doping concentration between $10^{16}$ cm$^{-3}$ and $10^{18}$ cm$^{-3}$.

In some embodiments, the source/drain region 440 may include epitaxial material. In some embodiments, the source/drain region 440 is an N type doped region. In some embodiments, the deep well 440 has a doping concentration between $10^{18}$ cm$^{-3}$ and $10^{19}$ cm$^{-3}$. In some embodiments, the heavily doped region 450 is an N type doped region. In some embodiments, the heavily doped region 450 has a doping concentration between $10^{18}$ cm$^{-3}$ and $10^{19}$ cm$^{-3}$.

Still refer to FIG. 4, the semiconductor structure 300 further includes a heavily doped region 452, a doped region 460, a doped region 462, a local contact 470, and a local contact 472. In some embodiments, the heavily doped region 452 having the second conductivity type disposed in a top region 444 of the source/drain region 440, in which the heavily doped region 450 and the heavily doped region 452 are separated from each other by the source/drain region 440. In some embodiments, the heavily doped region 452 is an N type doped region. In some embodiments, the heavily doped region 452 has a doping concentration is between $10^{18}$ cm$^{-3}$ and $10^{19}$ cm$^{-3}$. It should be noticed that all the source/drain region 440, the heavily doped region 450, and the heavily doped region 452 are N type doped regions, and each of which has a relatively high doping concentration compared to the other doped regions.

In some embodiments, the doped region 460 having the first conductivity type disposed on the deep well 420, and adjacent to the doped region 430, the source/drain region 440, and the heavily doped region 450. In some embodiments, the doped region 462 having the first conductivity type disposed on the deep well 420, and adjacent to the doped region 430, the source/drain region 440, and the heavily doped region 452. Specifically, the doped region 460 and the doped region 462 are separated by the doped region 430 and the source/drain region 440. In some embodiments, both the doped region 460 and the doped region 462 are P type doped regions, and the doped region 460 and the doped region 462 are respectively can be referred to as P well. In some embodiments, the doped region 460 and the doped region 462 respectively have a doping concentration between $10^{16}$ cm$^{-3}$ and $10^{18}$ cm$^{-3}$.

In some embodiments, the local contact 470 is electrically connected to the heavily doped region 450, and the local contact 472 is electrically connected to the heavily doped region 452. The local contact 470 and the local contact 472 are used for electrically connecting biases. In some embodiments, the local contact 470 is electrically connected to the heavily doped region 450 having N type dopants, and the local contact 472 is electrically connected to the heavily doped region 452 having N type dopants.

Please refer to FIG. 3 and FIG. 4 at the same time. In some embodiments, the doped region 430 has an I-shaped region, and the heavily doped region 450 and the heavily doped region 452 respectively have a rectangular-shaped region. In some embodiments, the doped region 430 is disposed below the heavily doped region 450 and the heavily doped region 452, as shown in FIG. 4. In some embodiments, a size of the heavily doped region 450 is substantially the same as a size of the heavily doped region 452. In some embodiments, the semiconductor structure 300 also includes a metal line 310, a metal line 312, a pad 320, and a pad 322. The metal line 310 is used for electrically connecting the heavily doped region 450 and the pad 320, and the metal line 312 is used for electrically connecting the heavily doped region 452 and the pad 322. In some embodiments, a material of the metal line 310, the metal line 312, the pad 320, and the pad 322 may include any metal, such as W, Cu, and/or Au, but not limited thereto. In some embodiments, the structure of the local contact 470 includes the metal line 310 and the pad 320, and the local contact 472 includes the metal line 312 and the pad 322. The metal line 310, the metal line 312, the pad 320 and the pad 322 are disposed in the regions where the scribe lines are formed. The further detail about testing circuit characteristics of the semiconductor structure 300 shown in FIG. 4 will be discussed in the following.

In detail, biases would be applied to the pad 320 and the pad 322, and then the resistance of the source/drain region 440 could be obtained. The charge carrier pathway (indicated by the arrows) within the semiconductor structure 300 shows in FIG. 4 when biases are applied. For example, the pad 322 connects a positive voltage, and the pad 320 connects to a ground terminal. Then, the charge carriers would flow through the heavily doped region 450, the source/drain region 440, and the heavily doped region 450. It is understood that the junction leakage between the heavily doped region 450 and the source/drain region 440 is quite small, and so the junction leakage can be ignored. Similarly, the junction leakage between the heavily doped region 452 and the source/drain region 440 is quite small, and so the junction leakage can be ignored. Accordingly, the resistance of the source/drain region 440 could be checked, thereby securing the reliability of the semiconductor device.

In addition, it should be noticed that, in some embodiments, the differences between FIG. 2 and FIG. 4 at least are the structure of the isolation region 240, and the types of the different doped regions. For example, in FIG. 2, the heavily doped region 130 and the heavily doped region 120 are P type doped regions. By contrast, in FIG. 4, the heavily doped region 450 and the heavily doped region 452 are N type doped regions.

Please refer to FIG. 5. The semiconductor structure 300 includes the substrate 410, the deep well 420, the doped region 430, the source/drain region 440, the top region 442, the heavily doped region 450, the doped region 460, and the local contact 470. It should be understood that reference numerals are repeated herein to show the same or similar features shown in FIG. 5, and the description above applies equally to the embodiments described below, and the details are not repeatedly described.

Still refer to FIG. 5. The semiconductor structure 300 further includes a heavily doped region 510, a doped region 520, a top region 522, and a local contact 530. In some embodiments, the doped region 520 has the first conductivity type disposed on the deep well 420 and adjacent to the doped region 430 and the source/drain region 440. In some embodiments, the doped region 520 is a P type doped region, and the doped region 520 also can be referred to as P well. In some embodiments, the doped region 520 has a doping concentration between $10^{16}$ cm$^{-3}$ and $10^{18}$ cm$^{-3}$. In some embodiments, the heavily doped region 510 has the first conductivity type disposed in a top region 522 of the doped region 520. In some embodiments, the heavily doped region 510 is a P type doped region. In some embodiments, the heavily doped region 510 has a doping concentration between $10^{18}$ cm$^{-3}$ and $10^{19}$ cm$^{-3}$. It should be noticed that all the source/drain region 440, the heavily doped region 450, and the heavily doped region 510 are relatively high doping concentration compared to the other doped regions.

In some embodiments, the local contact 530 is electrically connected to the heavily doped region 510. The local contact 530 is used for electrically connecting biases. In some embodiments, the local contact 470 is electrically connected to the heavily doped region 450 having N type dopants, and the local contact 530 is electrically connected to the heavily doped region 510 having P type dopants.

Please refer to FIG. 3 and FIG. 5 at the same time. In some embodiments, the doped region 430 has a first projection on the deep well 420, the heavily doped region 510 has a second projection on the deep well 420, and the first projection is spaced apart from the second projection. Specifically, there is a space S between the first projection of the doped region 430 and the second projection of the heavily doped region 510. In some embodiments, the heavily doped region 450 extends along a first direction D1, the heavily doped region 510 extends along a second direction D2, and the first direction D1 is substantially perpendicular to the second direction D2. In some embodiments, the semiconductor structure 300 also includes a metal line 314 and a pad 324. In some embodiments, the structure of the local contact 530 includes the metal line 314 and the pad 324. The metal line 314 and the pad 324 are disposed in the regions where the scribe lines are formed. In some embodiments, the material of the metal line 314 is the same as the material of the metal line 310 and the metal line 312. In some embodiments, the material of the pad 324 is the same as the material of the pad 320 and the pad 322. The further detail about testing circuit characteristics of the semiconductor structure 300 shown in FIG. 5 will be discussed in the following.

In detail, biases would be applied to the pad 320 and the pad 324, and then the junction leakage between the source/drain region 440 and the doped region 430 could be obtained. The charge carrier pathway (indicated by the arrows) within the semiconductor structure 300 shows in FIG. 5 when biases are applied. For example, the pad 320 connects a positive voltage, and the pad 324 connects to a ground terminal. Then, the charge carriers would flow through the heavily doped region 450, the source/drain region 440, the doped region 430, the doped region 520, and the heavily doped region 510. It is understood that the junction leakage between the doped region 430 and the doped region 520 is quite small, and so the junction leakage would be ignored. Similarly, the junction leakage between the doped region 520 and the heavily doped region 510 is quite small, and so the junction leakage can be ignored. Accordingly, the junction leakage between the source/drain region 440 and the doped region 430 could be tested, thereby securing the reliability of the semiconductor device.

In addition, it should be noticed that, in some embodiments, the differences between the FIG. 4 and FIG. 5 at least are the positions and the types of the heavily doped region 452 and the heavily doped region 510.

The semiconductor structure 300 of the present disclosure can test multiple circuit characteristics, such as the resistance of the source/drain region 440, and junction leakage between the source/drain region 440 and the doped region 430. Therefore, the present disclosure can provide a semiconductor structure which can test multiple circuit characteristics, thereby increasing the application of the TEG.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate having a first conductivity type;
a deep well having a second conductivity type disposed on the substrate;
a first doped region having the first conductivity type disposed on the deep well;
a source/drain region having the second conductivity type disposed on the first doped region;
a first heavily doped region having the second conductivity type disposed in a first top region of the source/drain region; and a second doped region having the first conductivity type disposed on the deep well, and adjacent to the first doped region, the source/drain region, and the first heavily doped region, wherein the first conductivity type is opposite to the second conductivity type.

2. The semiconductor structure of claim 1, further comprising:

a third doped region having the first conductivity type disposed on the deep well and adjacent to the first doped region and the source/drain region; and a second heavily doped region having the first conductivity type disposed in a second top region of the third doped region.

3. The semiconductor structure of claim 2, wherein the first heavily doped region and the second heavily doped region respectively have a doping concentration between $10^{18}$ cm$^{-3}$ and $10^{19}$ cm$^{-3}$.

4. The semiconductor structure of claim 2, wherein the first doped region and the third doped region respectively have a doping concentration between $10^{16}$ cm$^{-3}$ and $10^{18}$ cm$^{-3}$.

5. The semiconductor structure of claim 2, wherein the first doped region has a first projection on the deep well, the second heavily doped region has a second projection on the deep well, and the first projection is spaced apart from the second projection.

6. The semiconductor structure of claim 2, wherein the first heavily doped region extends along a first direction, the second heavily doped region extends along a second direction, and the first direction is substantially perpendicular to the second direction.

7. The semiconductor structure of claim 1, further comprising a second heavily doped region having the second conductivity type disposed in a second top region of the source/drain region, wherein the first heavily doped region and the second heavily doped region are separated from each other by the source/drain region.

8. The semiconductor structure of claim 7, wherein the first heavily doped region and the second heavily doped region respectively have a doping concentration is between $10^{18}$ cm$^{-3}$ and $10^{19}$ cm$^{-3}$.

9. The semiconductor structure of claim 7, further comprising a third doped region having the first conductivity type disposed on the deep well, and adjacent to the first doped region, the source/drain region, and the second heavily doped region.

10. The semiconductor structure of claim 9, wherein the first doped region and the third doped region respectively have a doping concentration between $10^{16}$ cm$^{-3}$ and $10^{18}$ cm$^{-3}$.

11. The semiconductor structure of claim 1, wherein the source/drain region has a doping concentration between $10^{18}$ cm$^{-3}$ and $10^{19}$ cm$^{-3}$.

12. The semiconductor structure of claim 1, wherein the deep well has a doping concentration between $10^{16}$ cm$^{-3}$ and $10^{17}$ cm$^{-3}$.

13. The semiconductor structure of claim 1, wherein the second doped region has a doping concentration between $10^{16}$ cm$^{-3}$ and $10^{18}$ cm$^{-3}$.

14. The semiconductor structure of claim 1, wherein the first conductivity type is P type, and the second conductivity type is N type.

* * * * *